Figure 1:
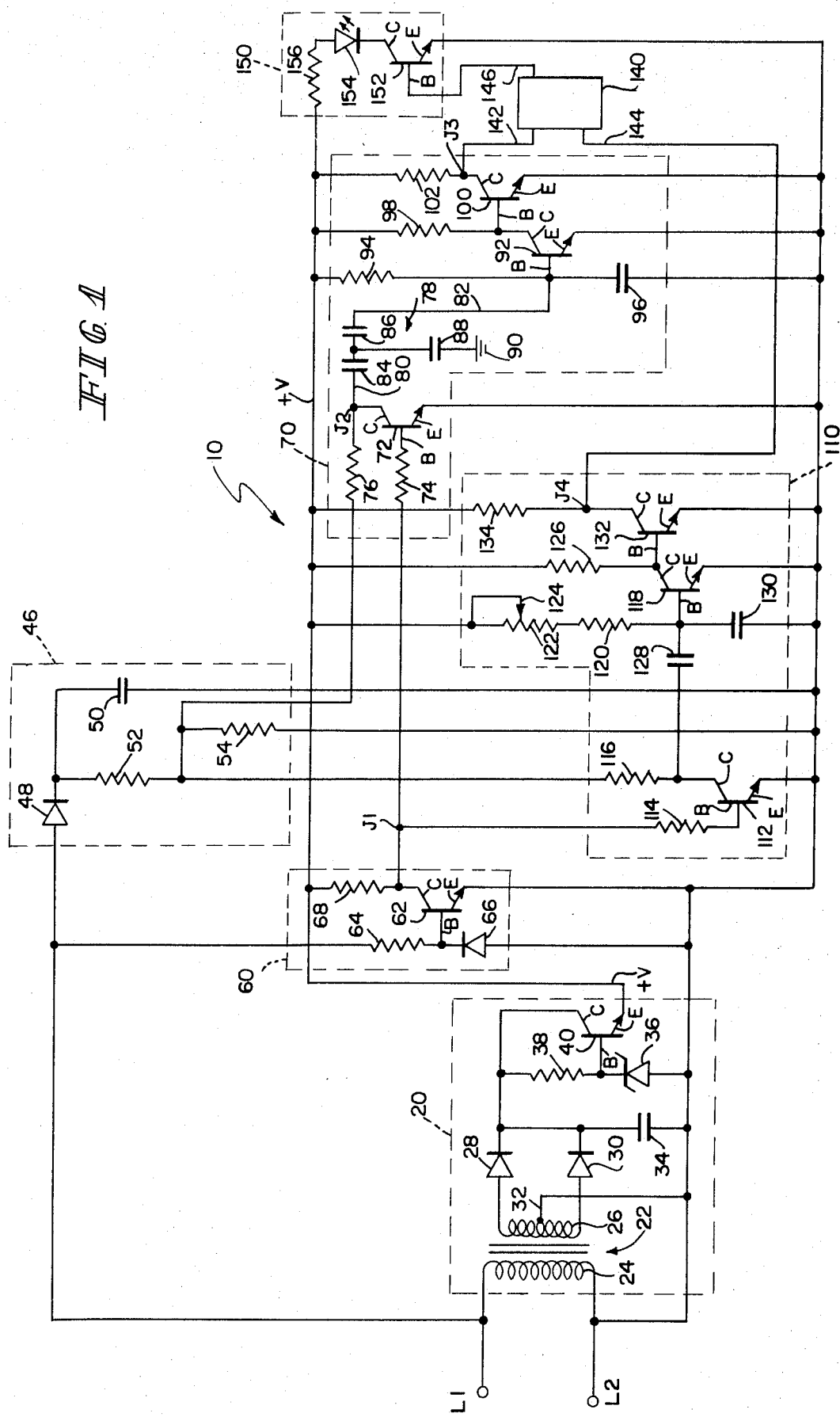

United States Patent [19]

French et al.

[11] 4,286,208

[45] Aug. 25, 1981

[54] FLUID INTERFACE DETECTOR

[75] Inventors: George R. French, South Berwick, Me.; John S. Oliver, Danville, N.H.

[73] Assignee: Emhart Industries, Inc., Indianapolis, Ind.

[21] Appl. No.: 110,009

[22] Filed: Jan. 7, 1980

[51] Int. Cl.³ .......................................... G01R 27/26
[52] U.S. Cl. ................................................ 324/61 R
[58] Field of Search ........ 324/61 R; 73/61 R, 61.1 R; 340/603

[56] References Cited

U.S. PATENT DOCUMENTS

| 3,181,557 | 5/1965 | Lannan, Jr. | 324/61 R X |
| 3,375,716 | 4/1968 | Herch | 324/61 R X |
| 3,443,220 | 5/1969 | Spademan | 324/61 R |
| 3,452,274 | 6/1969 | Povey | 324/61 R |

Primary Examiner—Stanley T. Krawczewicz
Attorney, Agent, or Firm—Robert F. Meyer; David W. Gomes

[57] ABSTRACT

A fluid interface detector includes a circuit for detecting the presence of one of two fluids to establish an interface level between the two fluids. The detection circuit produces an output signal having a variable pulse width determined by which of the two fluids is present. A reference signal of a predetermined pulse width is compared to the pulse width of the output signal of the detection circuit by a comparator which produces an output signal indicating which of the two fluids is present. The detection circuit includes at least one capacitive sensing device and in accordance with the present invention may include a plurality of capacitive sensing devices to detect a fluid interface at various levels.

20 Claims, 2 Drawing Figures

FLUID INTERFACE DETECTOR

The present invention relates to fluid interface detectors for detecting the interface of two fluids at a particular level. More particularly, the present invention is concerned with a detection circuit for detecting the interface between an electrically non-conductive liquid such as oil and an electrically conductive liquid such as water using capacitive sensing devices.

Many fluid interface detector systems are well-known to those skilled in the art. Most of these systems are either capacitive or inductive in nature and employ conventional detection circuits for measuring the level of at least one of the fluids in order to detect the interface between such fluid and another fluid. These conventional detection circuits have typically measured the magnitude of a voltage pulse being transmitted through the sensing device and compared the pulse to a threshold voltage to determine the presence or absence of a fluid at the sensing device. Accordingly, most of these conventional detection circuits require either individual drive supply sources or individual detection circuits in order to measure multiple fluid interface levels. Furthermore, most of these conventional detection circuits have individually detected the states of a plurality of sensing devices, and therefore, for each fluid interface level to be detected, it has been necessary to employ an equivalent number of either drive supply sources or detection circuits in order to detect the various fluid interface levels. As will be appreciated by those skilled in the art, considerable difficulty has heretofore been experienced in attempting to measure a plurality of fluid interface levels.

Problems which have commonly been associated with conventional fluid interface detectors which use capacitive sensing devices for detecting the fluid interface level are (1) the high sensitivity of such detectors to stray capacitances which can only be eliminated by including an adjustable element within the detection circuit of the detector; (2) the requirement for either a plurality of sensing electrodes or drive electrodes corresponding to the number of capacitive sensing devices used to detect a plurality of fluid interface levels; (3) the requirement that the electrical connections between the sensing electrodes and the detection circuit be very short and completely isolated from ground potential and other spurious or transient signals; and (4) the inability to detect small changes in the states of the sensing devices, thereby resulting in inaccurate detection of the location of the fluid interface.

In a co-pending application entitled "Detection Means for Multiple Capacitive Sensing Devices", filed May 14, 1979, and having a Serial No. 06/038,520, Robert G. Bristol has disclosed a circuit for detecting the level of a liquid which overcomes the problems enumerated above which are commonly associated with conventional detection circuits. In the present invention, the detection circuit disclosed by Robert G. Bristol has been adapted and combined with other circuits in a unique manner to detect the fluid interface level between an electrically conductive liquid such as water and an electrically non-conductive liquid such as oil.

In one broad aspect of the present invention, it is an object to provide a fluid interface detector for detecting the interface level between an electrically conductive liquid and an electrically non-conductive liquid which uses one or more capacitive sensing devices in a single detection circuit for detecting the states of the sensing device(s) in a continuum and which has an output which varies linearly with respect to changes in the states of the sensing device(s).

According to the present invention, the fluid interface detector has no direct electrical contact to the fluids being monitored, the measurement of the fluid interface is independent of variations in supply voltage, the interface level between the fluids is accurately located, and multiple interface levels are detectable in a continuum using a single detection circuit.

Further according to the present invention, it is an object to provide a fluid inteface detector for detecting multiple fluid interface levels which utilizes a time measurement technique for detecting the fluid interface in lieu of a comparison of the magnitude of voltage pulses.

It is a further objective of the present invention to provide a fluid interface detector which has fewer components, is less expensive, and is less complex than conventional fluid interface detectors for detecting multiple fluid interface levels.

In accordance with the present invention, a fluid interface detector includes a circuit for detecting the presence of at least two fluids to establish an interface level therebetween wherein the detection circuit produces an output signal having a variable pulse width which is determined by the nature of the fluid which is present, at least one circuit for producing a reference signal having a predetermined pulse width, and means for comparing the pulse width of the output signal of the detection circuit to the predetermined pulse width of the reference signal wherein an output signal is produced which is indicative of whether a first fluid or a second fluid is present. The detection circuit utilizes one or more capacitive sensing devices which capacitively transmit a series of electrical pulses. The electrical pulses are modified as an electrically conductive liquid which is grounded is moved into close proximity to each capacitive sensing device. The modification of the electrical pulses is converted by the detection circuit to an output signal having various pulse widths. For each additional capacitive sensing device included in the detection circuit, the fluid interface detector includes a circuit for producing additional reference signals, each of which has a different predetermined pulse width and an additional means for comparing each reference signal of the reference circuit to the output signal of the detection circuit.

Figure 2:
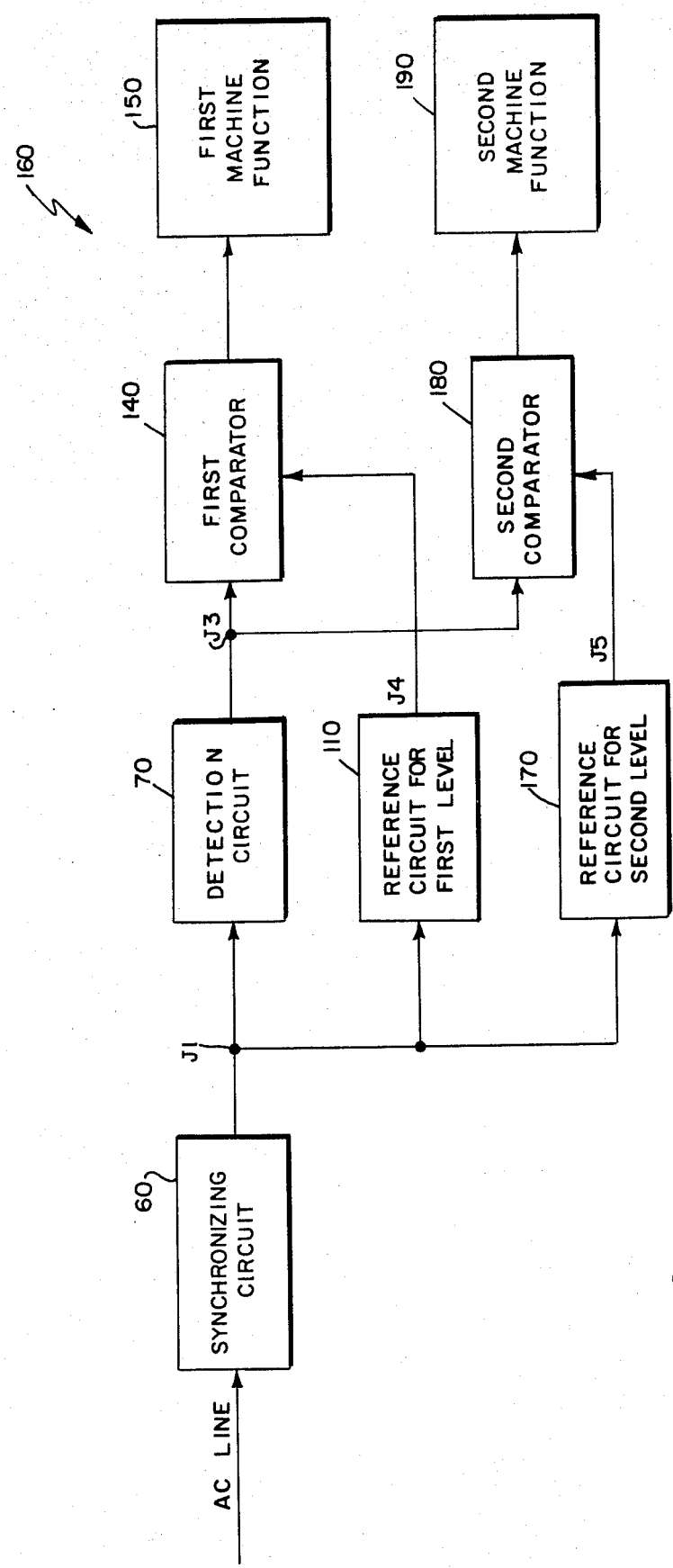

While various features of the present invention have been described hereinabove, other features and advantages of the fluid interface detector of the present invention will be apparent from the following detailed description of an embodiment thereof, which description should be considered in conjunction with the accompanying drawings, in which:

FIG. 1 is a schematic circuit diagram of a liquid interface detector constructed in accordance with the present invention; and FIG. 2 is a functional block diagram of an adaptation of the liquid interface detector of FIG. 1 to detect fluid interfaces at various levels.

The present invention is a capacitive fluid interface detector for detecting the interface level of levels between an electrically non-conductive liquid such as oil and an electrically conductive liquid such as water. In general, a detection circuit, which includes at least one capacitive sensing device, produces a voltage pulse having a pulse width which is determined by whether or not the electrically non-conductive liquid or the electrically conductive liquid is in proximity to the sensing device. If the sensing device is in proximity to the electrically non-conductive liquid, the pulse width of the output voltage of the detection circuit will be one value. As the electrically conductive liquid is presented at each capacitive sensing device in the detection circuit, the pulse width of the output voltage of the detection circuit will continuously decrease. By comparing the pulse width of the output voltage of the detection circuit to various reference signals having different predetermined pulse widths, the interface level between the two liquids can be accurately detected.

Referring to FIG. 1, there is illustrated a circuit diagram of a fluid interface detector for detecting a single interface level between an electrically non-conductive liquid such as oil and an electrically conductive liquid such as water. A source of A.C. power such as 120 volts A.C. (not shown) may be connected directly or indirectly through ancillary circuits and switches to the input lines L1 and L2 of the interface detector 10. Connected across input lines L1 and L2 is a regulated D.C. power supply 20 which includes a step-down transformer 22 for reducing the voltage of the A.C. power supply (not shown) having a primary side 24 connected to the A.C. input lines L1, L2, a seconary side 26 connected to diodes 28, 30 which in combination provide full-wave rectifiction of the low-voltage A.C. signal supplied by the secondary side 26, and a center tap 32 off of the secondary side 26 connected to one of the A.C. lines L2. By connecting the center tap 32 to the A.C. line L2, a reference point is established for the D.C. voltage supplied by power supply 20 which may be considered the equivalent of the ground to the detector circuit 10. The anodes of diodes 28, 30 are connected in parallel to the secondary side 26 of the transformer 22, and the cathodes of diodes 28, 30 are connected in parallel to a capacitor 34 to filter the rectified signal. A zener diode 36 electrically coupled in parallel with capacitor 34 is biased by a resistor 38 to regulate the D.C. voltage of power supply 20. An NPN transistor or bipolar switching device 40 has its base B connected to the junction between the zener diode 36 and its bias resistor 38, its collector C connected to the cathodes of diodes 28, 30, and its emitter connected to a D.C. power supply line (+V).

The detector circuit 10 also includes an unregulated D.C. power supply 46. The unregulated D.C. power supply 46 includes a diode 48 having its anode connected to the A.C. line L1 to half-wave rectify the A.C. signal. The cathode of diode 48 is connected through a capacitor 50 to the ground or A.C. input line L2 of the detector circuit 10 to filter the half-wave rectified signal. The magnitude of the D.C. voltage supplied by power supply 46 is reduced by a voltage divider network consisting of resistors 52 and 54 which are connected in series between the cathode of diode 48 and the ground or A.C. input line L2 of the detector circuit 10.

The interface detector 10 further includes a synchronizing circuit 60 which supplies the necesary signals for driving the detector circuit 10. An NPN transistor or bipolar switching device 62 has its base B connected through a resistor 64 to the A.C. input line L1 and through a blocking diode 66 to the A.C. input line L2. The collector of the transistor 62 is connected through a bias resistor 68 to the D.C. power supplly line (+V) and serves as the output of the synchronizing circuit 60. The emitter of the transistor 62 is also connected to the ground or A.C. input line L2 of the detector circuit 10. In operation, transistor 62 is periodically turned on and off in response to the A.C. signal of input lines L1, L2 to provide a periodic square-wave drive signal at junction J1. The drive signal supplied by the synchronizing circuit 60 drives a detection circuit 70 and a reference circuit 110 in a manner to be described hereinafter. Importantly, it should be noted that the signal produced at junction J1 will also be synchronized with the half-wave rectified D.C. voltage supplied by power supply 46.

Continuing to refer to FIG. 1, detection circuit 70 is shown in one embodiment for detecting only one fluid interface level. It will be understood and explained in more detail hereinafter that the detection circuit 70 can be adapted for detecting a plurality of interface levels of the two fluids. Importantly, the detection circuit 70 detects various states of one or more capacitive sensing devices in a continuum which produces an output which is a time interval measurement, Vis-a-Vis the progressive modification of electrical pulses in response to a change in the state of the sensing device or devices. As will become more apparent in the detailed description which follows, the various states of the capacitive sensing devices are detected in a continuum by converting a current to time intervals which are indicative of the various states of the capacitive sensing device or devices.

The detection circuit 70 includes an NPN transistor or bipolar switching device 72 having its base B connected to the series of electrical pulses produced by the synchronizing circuit 60 at junction J1 through a bias resistor 74. the emitter E of the transistor 72 is connected to the ground or A.C. line L2 of the interface detector circuit 10 and the collector C of transistor 72 is connected to the unregulated D.C. power supply 46 through a bias resistor 76. The collector C of the transistor 72 is also connected to a capacitive sensing device 78 which includes a single drive electrode 80 and a single sense electrode 82. The electrical equivalent of the capacitive sensing device 78 includes capacitors 84, 86 which are formed between conductive strips (not shown) and an electrically conductive liquid provided in close proximity thereto. The electrically conductive liquid, such as water, is connected to ground 90 and forms a shunt capacitance 88 between the conductive strips and ground 90. Accordingly, the series of electrical pulses produced by the synchronizing circuit 60 are periodically capacitively transmitted through the capacitors 84, 86. As the electrically conductive liquid is moved into close proximity to the capacitors 84, 86, the shunt capacitance 88 is formed between the capacitors 84, 86 and ground 90 by the electrically conductive liquid, and a portion of the capacitively transmitted drive signal is shunted to ground potential 90. By coupling additional capacitive sensing devices to the drive electrode 80 and the sense electrode 82, the drive signal will be transmitted through each of the capacitive sensing devices in parallel, and as the electrically conductive liquid is brought into proximity to each capacitive sensing device, the transmitted signal will progressively be modified as more and more of the signal is shunted to ground 90 through the shunt capitance 88 of the liquid. The operation of detection circuit 70 utilizing a plurality of capacitive sensing devices 78 is more particularly described in Robert G. Bristol's co-pending application, Ser. No. 06/038,520, filed May 14, 1979, which is hereby incorporated by reference and made a part of this disclosure.

The detection circuit 70 also includes a second NPN transistor 92 having its base B connected to the single sense electrode 82 of the capacitive sensing device 78. The transistor 98 is normally biased on by a resistor 98 connecting the collector C of the transistor 92 to the D.C. power supply line (+V). The D.C. power supply line (+V) provides the necessary power to maintain the transistor 92 in its normally on state. Transistor 92 further has its emitter E electrically coupled to ground or the input line L2 of the interface detector circuit 10. A capacitor 96 is connected from the base B of transistor 92 to the ground of interface detector circuit 10 and a resistor 94 is also connected to the base B of transistor 92 and to the D.C. power supply line (+V). Resistor 94 and capacitor 96 in conbination form an RC circuit for determining the period of time during which transistor 92 will operate in its off state. As will be described in more detail hereinafter, the time period associated with the off state of transistor 92 is variable in relation to whether the series of electrical pulses capacitively transmitted by the capacitive sensing device 78 has been shunted by the close proximity of the electrically conductive liquid. When the capacitively transmitted electrical pulses are shunted by the electrically conductive liquid, the time period during which the transistor 92 will be off decreases, and therefore the time period during which transistor 92 is on increases.

A third transistor 100 of the detection circuit 70 has its base B connected to the collector C of transistor 92, its emitter E connected to the ground or A.C. input line L2 of the interface detector circuit 10, and it collector connected to the D.C. power supply line (+V) through a bias resistor 102. Transistor 100 is included in the detector circuit 70 to shape the waveform produced at the collector C of transistor 92 and is not absolutely necessary for the operation of detection circuit 70. Accordingly, were transistor 100 unavailable, it may be deleted without significantly affecting the operation of detection circuit 70. It should be noted that the collector C of transistor 100 forms the output of the detection circuit 70 and is indicated as junction J3.

In the operation of detection circuit 70, a negative-going voltage step having a predetermined magnitude established by the synchronizing circuit 60 is applied at junction J2 to the drive electrode 80 of the capacitive sensing device 78. A negative-going input of current corresponding to the state of the sensing device 78 is capacitively transmitted to the sense electrode 82. At the base B of transistor 92, a voltage pulse has a magnitude which is variable in accordance with the state of the capacitive sensing device 78. As long as the electrically non-conductive liquid is in proximity to the capacitive sensing device, the magnitude of the voltage at the base B of transistor 92 remains large. However, when the electrically conductive liquid is brought into proximity to the capacitive sensing device 78, the magnitude of the voltage at the base B of transistor 92 is modified or reduced. Importantly, it should be understood that this voltage at base B of transistor 92 is a negative voltage corresponding to the negative-going impulse of current. However, it should be pointed out that the negative voltage at base B of transistor 92 also includes a sufficient positive portion to activate or turn on the transistor 92. This positive portion of the voltage at base B of transistor 92 is supplied by the bias resistors 94, 98 and the D.C. power supply line (+V). Accordingly, until such time as a negative-going voltage is capacitively transmitted by capacitive sensing device 78, the transistor 92 is turned on. With the transmission of each electrical pulse through the capacitive sensing device 78, the voltage at the base B of transistor 92 becomes negative and the transistor 92 is turned off. When the electrically conductive liquid is brought into proximity to the capacitive sensing device 78, the signal is modified so that the negative voltage at base B of transistor 92 becomes smaller (becomes more positive), and therefore, the time that transistor 92 is off also becomes less. As the time interval during which transistor 92 is off decreases, the pulse width of the output signal at J3 of the detection circuit 70 also decreases.

Also forming a part of the interface detector 10 is a reference circuit 110 which produces a reference signal having a predetermined pulse width which is compared to the pulse width of the output J3 of the detection circuit 70. In the embodiment of reference circuit 110 illustrated in FIG. 1, the circuit 110 is a conventional one-shot monostable multivibrator. However, it should be understood that the present invention is not intended to be limited to the particular circuit configuration of reference circuit 110 illustrated in FIG. 1, since other circuits are available for accomplishing the same or similar objective of the circuit 110 in the present invention.

Circuit 110 includes an NPN transistor or bipolar switching device 112 having its base B connected to the series of electrical pulses produced by the synchronizing circuit 60 at junction J1 through a bias resistor 114. The emitter E of the transistor 112 is connected to the ground of the interface detector circuit 10 and the collector C is connected to the unregulated D.C. power supply 46 through a bias resistor 116. Another NPN transistor 118 has its base B biased by resistor 120 and variable resistor 122 having a wiper 124. The collector C of transistor 118 is biased by resistor 126. Resistors 120, 122, and 126 are each connected to the D.C. power supply line (+V). The base B of transistor 118 is also connected to the collector C of transistor 112 through a capacitor 128. A capacitor 130 is also interposed between the base B of transistor 118 and the ground of the interface detector circuit 10. Capacitors 128, 130 charge and discharge in a conventional manner to provide stable and unstable states of the multivibrator circuit 110. Importantly, it should be noted that adjustment of the wiper 124 of the variable resistor 122 will vary the frequency of the signal produced at the collector C of transistor 118 to produce an output signal of the reference circuit 110 having a desired pulse width. Another NPN transistor or bipolar switching device 132 has its base B connected to the collector C of transistor 118, its collector C connected to the D.C. power supply line (+V) through a bias resistor 134, and its emitter E connected to the ground of the interface detector circuit 10. Again, transistor 132 is included to shape the waveform produced at the collector C of transistor 18 and is not critical to the performance of the reference circuits 110. Accordingly, reference circuit 110 would operate without the transistor 132. Junction J4 at the collector C of the transistor 132 represents the output of the reference circuit 110. The output reference signal of circuit 110 at junction J4 will have a pulse width predetermined by the adjustment of the variable resistor 122.

A means 140 for comparing the pulse width of the output signal at junction J3 of the detector circuit 70 and the output reference signal at junction J4 of the reference circuit 110 has an input 142 connected to the junction J3 and an input 144 connected to the junction J4. In one embodiment of the interface detector 10, the comparing means 140 is a flip-flop circuit included in an integrated circuit package identified by number 4013 and manufactured by National Semiconductor Corporation. The comparing means 140 has an output 146 which is low when the pulse width of the output of the detector circuit 70 is greater than the pulse width of the reference signal of reference circuit 110 and indicates that the electrically non-conductive liquid is in proximity to the capacitive sensing device 78. The output 146 is high when the pulse width of the output signal at junction J3 of the detection circuit 70 is less than the pulse width of the signal at junction J4 of the reference circuit 10, indicating that the electrically conductive liquid is in proximity to the capacitive sensing device 78. It should be noted that the pulse width of the output signal at J4 of the reference circuit should be set by adjusting the wiper 124 of the variable resistor 122 so that it represents neither the state of the capacitive sensing device 78 when the electrically non-conductive liquid is present nor the state of the capacitive sensing device 78 when the electrically conductive liquid is present. Accordingly, by comparing the pulse width of the output (at junction J3) of the detection circuit 70 to the pulse width of the reference signal (at junction J4) of the reference circuit 110, the output 146 will indicate that either the electrically non-conductive liquid is present at the capacitive sensing device 78 or that the electrically conductive liquid is present at the capacitive sensing device 78.

As further illustrated in FIG. 1, a machine function 150 of any desired type can be activated by the output 146 of the comparing means 140 to indicate either the presence of the electrically non-conductive liquid at the capacitive sensing device 78 or the presence of the electrically conductive liquid at the capacitive sensing device 78. In one embodiment, the machine function 150 might include a transistor 152 having its base B connected to the output 146 of the comparing means 140, its emitter E connected to the ground of the interface detector circuit 10, and its collector C connected to a light-emitting source 154 such as a light-emitting diode to indicate either the presence or absence of the electrically conductive liquid in proximity to the capacitive sensing device 78. A resistor 156 connected to the light-emitting source 154 and the D.C. power supply line (+V) serves to bias the light-emitting diode. The optical signal provided by the light source 154 will provide a visual feedback to the user of the fluid interface detector 10.

As best illustrated in FIG. 2, the interface detector circuit 10 described and shown in FIG. 1 can be adapted to detect various fluid interface levels in a multiple level interface detector ciruit 160. The multiple interface detector 160 is shown in functional block diagram form since each of the elements represented by the blocks have previously been described. Synchronizing circuit 60 produces a series of electrical pulses at junction J1 which synchronously drive the detection circuit 70 to produce an output signal at junction J3 having a pulse width determined by the number of capacitive sensing devices which have been shunted to ground by the electrically conductive liquid. Accordingly, detection circuit 70 must be constructed with a plurality of capacitive sensing devices in the manner disclosed in the co-pending application, Ser. No. 06/038,520, filed May 14, 1979. Reference circuit 110 is synchronously driven by the series of electrical pulses at junction J1 to provide an output reference signal at junction J4 having a first predetermined pulse width which is compared to the pulse width of the output at junction J3 of the detection circuit 70 by a first comparator 140. Again, the pulse width of the reference signal at junction J4 of reference circuit 110 is selected so that if the pulse width at junction J3 is greater than the pulse width of the reference signal at J4, the output of the first comparator 140 indicates that the electrically non-conductive liquid is in proximity to the first capacitive sensing device and if the pulse width of the output at junction J3 is less than the pulse width of the reference signal at J4, the output of the first comparator 140 indicates that the electrically conductive liquid is in proximity to the first sensing device. The output of the first comparator 140 can be utilized to operate a first machine function 150 which may either provide an indication to the user of the multiple interface detector circuit 160 or operate some other machine function.

Also synchronously driven by the series of electrical pulses produced by the synchronizing circuit 60 at junction J1 is a second reference circuit 170 having an output reference signal produced at junction J5 which has a second predetermined pulse width which in the present embodiment is less than the first predetermined pulse width of the reference circuit 110. The pulse width of the reference signal produced by the second reference circuit 170 is also compared to the pulse width of the output signal at junction J3 of the detection circit 70 by a second comparator 180. Again, if the pulse width of the output at junction J3 of the detection circuit 70 is greater than the pulse width of the reference signal produced by the second reference circuit 170, the second comparator 180 produces an output indicating that the electrically non-conductive liquid is in proximity to the second capactive sensing device of the detection circuit 70. If the pulse width of the output at junction J3 of the detection circuit 70 is less than the pulse width of the reference signal produced by the second reference circuit 170 at junction J5, the second comparator 180 produces an output signal indicating that the electrically conductive liquid is in proximity to the second capacitive sensing device of the detection circuit 70. Again, the output of the second comparator 180 may be utilized to operate a second machine function 190 which may be the same or different than the first machine function 150.

What is claimed is:

1. A fluid interface detector, comprising a circuit for detecting the presence of at least two fluids to establish an interface level between the fluids, the circuit producing an output signal of varying duration determined by which fluid is present, at least one circuit for producing at least one reference signal of a predetermined duration, and means for comparing the duration of the output signal of the detection circuit to the predetermined duration of the reference signal and producing a signal indicative of which fluid is present.

2. The apparatus as recited in claim 1 wherein the output signal of the comparing means indicates the presence of a first fluid when the duration of the output signal of the detection circuit is less than the predetermined duration of the reference signal and indicates the presence of a second fluid when the duration of the output signal of the detection circuit greater than the predetermined duration of the reference signal.

3. The apparatus as recited in claim 2 wherein the first fluid is an electrically conductive liquid and the second fluid is an electrically non-conductive liquid.

4. The apparatus as recited in claim 3, further comprising a circuit for supplying a series of electrical pulses to synchronously drive the detection circuit and the reference circuit.

5. The apparatus as recited in claim 4 wherein the detection circuit includes at least one capacitive sensing device for capacitively transmitting the electrical pulses and the output of the detection circuit has a pulse width determined by the fluid in proximity to the sensing device.

6. The apparatus as recited in claim 5 wherein the electrically conductive liquid is grounded and the magnitude of the electrical pulses is reduced when the electrically conductive liquid is in proximity to the sensing device.

7. The apparatus as recited in claim 6 wherein the detection circuit includes a switching device which is biased to establish a first mode of operation thereof, the switching device being periodically operated in a second mode of operation for a period of time which is variable in accordance with which liquid is in proximity to the sensing device.

8. The apparatus as recited in claim 7 wherein the period of time associated with the second mode of operation of the switching device determines the pulse width of the output of the detection circuit.

9. The apparatus as recited in claim 8 wherein the switching device is biased to be normally on and is periodically turned off for the period of time associated with the second mode of operation to determine the pulse width of the output of the detection circuit.

10. The apparatus as recited in claim 9 wherein the reference circuit includes a monostable multivibrator for producing a series of electrical pulses and means for variably adjusting the width of the pulse to establish an output having a predetermined pulse width for comparison to the pulse width of the output of the detection circuit.

11. The apparatus as recited in claim 10 wherein a first state of the output of the comparing means indicates that the electrically conductive liquid is in proximity to the sensing device and a second state of the output of the comparing means indicates that the electrically non-conductive liquid is in proximity to the sensing device.

12. The apparatus as recited in claim 11, further comprising means for indicating the presence of the electrically conductive liquid in response to the first state of the output of the comparing means.

13. The apparatus as recited in claim 6 wherein the detection circuit includes a first and second capacitive sensing device having a common drive electrode and a common sense electrode for capacitively transmitting the electrical pulse and the output of the detection circuit has a pulse width which is variable in a continuum in accordance with the position of the electrically conductive liquid in relation to the first and second sensing devices.

14. The apparatus as recited in claim 12 wherein the pulse width of the output of the detection circuit progressively decreases as the number of sensing devices contacted by the electrically conductive liquid increases, the output of the detection circuit having a first pulse width when the conductive liquid is contacting the first sensing device and a second pulse width when the conductive liquid is contacting both the first and second sensing devices.

15. The apparatus as recited in claim 14, further comprising a first circuit for producing at least one reference signal of a first predetermined pulse width, and a second circuit for producing at least one reference signal of a second predetermined pulse width.

16. The apparatus as recited in claim 15, further comprising a first means for comparing the pulse width of the output signal of the detection circuit to the first predetermined pulse width of the first reference circuit and producing an output signal indicative of the liquid in proximity to the first sensing device.

17. The apparatus as recited in claim 16, further comprising a second means for comparing the pulse width of the output signal of the detection circuit to the second predetermined pulse width of the second reference circuit and producing an output signal indicative of the liquid in proximity to the second sensing device.

18. The apparatus as recited in claim 17 wherein the output of the first comparing means indicates the presence of the electrically conductive liquid at the first sensing device when the pulse width of the output signal of the detection circuit is less than the first predetermined pulse width of the first reference circuit and the output of the second comparing means indicates the presence of the electrically conductive liquid at the second sensing device when the pulse width of the output signals of the detection circuit is less than the second predetermined pulse width of the second reference circuit.

19. The apparatus as recited in claim 18 wherein the second predetermined reference pulse width is less than the first predetermined reference pulse width.

20. The apparatus as recited in claim 19 wherein the electrically conductive liquid is water and the electrically non-conductive liquid is oil.

* * * * *